(12) United States Patent
Park et al.

(10) Patent No.: US 9,287,132 B2
(45) Date of Patent: Mar. 15, 2016

(54) MULTI-SELECTIVE POLISHING SLURRY COMPOSITION AND A SEMICONDUCTOR ELEMENT PRODUCTION METHOD USING THE SAME

(71) Applicant: Industry-University Cooperation Foundation Hanyang University, Seoul (KR)

(72) Inventors: Jea-Gun Park, Gyeonggi-do (KR); Un-Gyu Paik, Seoul (KR); Jin-Hyung Park, Ulsan (KR); Hao Cui, Seoul (KR); Jong-Young Cho, Seoul (KR); Hee-Sub Hwang, Seoul (KR); Jae-Hyung Lim, Seoul (KR); Ye-Hwan Kim, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 0 days.

(21) Appl. No.: 14/639,803

(22) Filed: Mar. 5, 2015

(65) Prior Publication Data
US 2015/0179470 A1   Jun. 25, 2015

Related U.S. Application Data

(62) Division of application No. 13/386,494, filed as application No. PCT/KR2010/004468 on Jul. 9, 2010, now abandoned.

(30) Foreign Application Priority Data

Jul. 21, 2009  (KR) .................. 10-2009-0066541

(51) Int. Cl.
*H01L 21/3105* (2006.01)
*H01L 21/321* (2006.01)
*C09K 3/14* (2006.01)
*C09G 1/02* (2006.01)

(52) U.S. Cl.
CPC ............ *H01L 21/31056* (2013.01); *C09G 1/02* (2013.01); *H01L 21/31053* (2013.01); *H01L 21/3212* (2013.01); *C09K 3/1463* (2013.01)

(58) Field of Classification Search
None
See application file for complete search history.

(56) References Cited

U.S. PATENT DOCUMENTS

| 2008/0280442 | A1* | 11/2008 | Kwak et al. ................... 438/693 |
| 2009/0079012 | A1* | 3/2009 | Park et al. ..................... 257/401 |
| 2010/0099260 | A1* | 4/2010 | Matsumoto .............. C09G 1/02 438/693 |

FOREIGN PATENT DOCUMENTS

KR   2005060213 A * 6/2005

*Primary Examiner* — Allan Olsen
*Assistant Examiner* — Margaret D Klunk
(74) *Attorney, Agent, or Firm* — Osha + Liang LLP

(57) ABSTRACT

Provided are a multi-selective polishing slurry composition and a semiconductor element production method using the same. A silicon film provided with element patterns is formed on the uppermost part of a substrate having a first region and a second region. The element pattern density on the first region is higher than the element pattern density on the second region. Formed in sequence on top of the element patterns are a first silicon oxide film, a silicon nitride film and a second silicon oxide film. The substrate is subjected to chemical-mechanical polishing until the silicon film is exposed, by using a polishing slurry composition containing a polishing agent, a silicon nitride film passivation agent and a silicon film passivation agent. The polishing slurry composition may be a mixture of 100 parts by weight of a polishing agent suspension, containing a polishing agent, and from 40 to 120 parts by weight of an additive solution, and the additive solution can contain 100 parts by weight of a solvent, from 0.01 to 5 parts by weight of a silicon nitride film passivation agent and from 0.01 to 5 parts by weight of a silicon film passivation agent.

13 Claims, 6 Drawing Sheets

MULTI-SELECTIVE POLISHING SLURRY COMPOSITION AND A SEMICONDUCTOR ELEMENT PRODUCTION METHOD USING THE SAME

TECHNICAL FIELD

The present invention relates to a polishing slurry composition and, more particularly, to a slurry composition for polishing an oxide film and a nitride film, and a method for producing a semiconductor device using the same.

BACKGROUND ART

Ultra large scale integration (ULSI) has been achieved through high performance and high integration of semiconductor devices. In the ULSI, the minimum line width has a submicron size, and multi-layer wirings should be interconnected. When wirings having a very small line width are formed in multiple layers, it may be difficult to ensure a lithography margin in the upper layer. Thus, it is necessary to globally planarize each layer to ensure the lithography margin. To this end, a chemical mechanical polishing (CMP) process has been developed.

However, even when applying the CMP process, it is difficult to achieve overall planarization over the entire area of a semiconductor device. In particular, the semiconductor device includes a cell array area and a peripheral circuit area adjacent to the cell array area. Typically, the cell array area has a pattern density higher than that of the peripheral circuit area. In this case, during the CMP process, the cell array area is over-polished due to high polishing rate, the peripheral circuit area is under-polished due to low polishing rate, and thus the planarization cannot be achieved over the entire area. In this case, an error may occur during operation of the device.

DISCLOSURE

Technical Problem

A technical problem of the present invention is to provide a polishing slurry composition and a method for producing a semiconductor device using the same, which can improve the degree of overall planarization when polishing a substrate including two areas having different pattern densities.

Technical Solution

In one aspect, the present invention provides a polishing slurry composition. The polishing slurry composition may be a mixture of 100 parts by weight of a polishing agent suspension containing a polishing agent and 40 to 120 parts by weight of an additive solution, and the additive solution contain 100 parts by weight of a solvent, 0.01 to 5 parts by weight of a silicon nitride film passivation agent, and 0.01 to 5 parts by weight of a silicon film passivation agent.

The additive solution may contain 100 parts by weight of a solvent, 0.05 to 0.2 parts by weight of a silicon nitride film passivation agent, and 0.1 to 0.3 parts by weight of a silicon film passivation agent.

The silicon nitride film passivation agent may be poly (acrylic acid), poly(alkyl methacrylate), acrylamide, methacrylamide, or ethyl-methacrylamide, and the silicon film passivation agent may be poly(vinyl pyrrolidone), vinylpyridine, or vinylpyrrolidone.

In another aspect, the present invention provides a method for producing a semiconductor device. The method comprises forming device patterns including a silicon film at the uppermost part of the device patterns on a substrate including a first area and a second area. The device patterns on the first area have a density higher than that of the device patterns on the second area. A first silicon oxide film is formed on the device patterns. A silicon nitride film is formed on the silicon oxide film. A second silicon oxide film is formed on the silicon nitride film. The substrate is chemically mechanically polished using a polishing slurry composition containing a polishing agent, a silicon nitride film passivation agent, and a silicon film passivation agent until the silicon film is exposed.

The first silicon oxide film may have a thickness that can fill the gap between the device patterns on the first area. The device patterns may be gate patterns including a polysilicon film at the uppermost part.

Advantageous Effects

As described above, according to the present invention, a chemical mechanical polishing (CMP) process is performed using a polishing slurry composition containing a polishing agent, a silicon nitride film passivation agent, and a silicon film passivation agent. During the polishing process, the silicon nitride film passivation agent contained in the polishing slurring composition forms a passivation film on the silicon nitride film exposed on the first area, thereby reducing the polishing rate of the insulating film on the first area compared to the second area. Therefore, it is possible to prevent over-polishing in the first area in which the density of the device patterns is high, thereby forming a globally planarized surface. In other words, it is possible to primarily compensate for the pattern density effect of the device patterns.

Moreover, when the silicon film is exposed as the polishing process is further performed, the silicon film passivation agent contained in the polishing slurry composition forms a passivation film on the silicon film, thereby preventing the silicon film from being polished.

MODE FOR INVENTION

Figure 1:
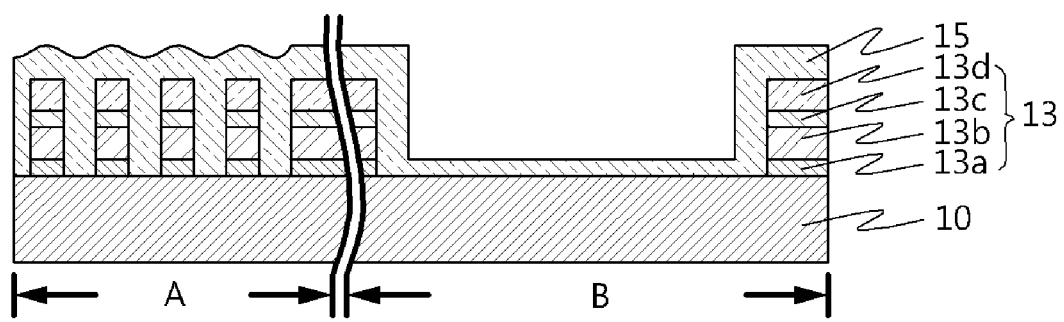
FIGS. 1 to 4 are cross-sectional views showing a method for producing a semiconductor device in accordance with an exemplary embodiment of the present invention.

Hereinafter, specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the present invention. In the drawings, the thicknesses of layers and regions are exaggerated for clarity. The same reference numerals denote the same devices throughout the specification.

A polishing slurry composition in accordance with an exemplary embodiment of the present invention is a mixture of a polishing agent suspension and an additive solution, and the polishing slurry composition may be prepared by mixing 40 to 120 parts by weight of the additive solution with respect to 100 parts by weight of the polishing agent suspension.

The additive solution may contain a silicon nitride film passivation agent, a silicon film passivation agent, and a first solvent. The silicon nitride film passivation agent is a material that has excellent adhesion to the silicon nitride film compared to the silicon oxide film and selectively forms a passivation film on the silicon nitride film to relatively reduce the polishing rate of the silicon nitride film. For example, the silicon nitride film passivation agent may be an anionic organic polymer containing a carboxylic acid as an anionic group. The silicon nitride film passivation agent may be, for example, poly(acrylic acid), poly(alkyl methacrylate), acrylamide, methacrylamide, or ethyl-methacrylamide. The weight average molecular weight of the poly(acrylic acid) and the poly(alkyl methacrylate) may be 2,000 to 1,000,000, preferably 5,000 to 500,000, more preferably 10,000 to 100,000. The silicon nitride film passivation agent may be contained in an amount of 0.01 to 5 parts by weight, preferably 0.03 to 3 parts by weight, more preferably 0.05 to 0.2 parts by weight with respect to 100 parts by weight of the first solvent.

The silicon film passivation agent is a material that has excellent adhesion to the silicon film compared to the silicon oxide film and selectively forms a passivation film on the silicon film to relatively reduce the polishing rate of the silicon film. The silicon film passivation agent may be, for example, poly(vinyl pyrrolidone), vinylpyridine, or vinylpyrrolidone. The weight average molecular weight of the poly(vinyl pyrrolidone) may be 1,000 to 500,000, preferably 2,000 to 100,000, more preferably 3,000 to 10,000. The silicon film passivation agent may be contained in an amount of 0.01 to 5 parts by weight, preferably 0.05 to 3 parts by weight, more preferably 0.1 to 0.3 parts by weight with respect to 100 parts by weight of the first solvent.

The first solvent may be water, preferably deionized water.

The polishing agent suspension may contain a polishing agent, a second solvent, and a dispersant. The polishing agent may be a metal oxide selected from the group consisting of silica, ceria, alumina, titania, zirconia, and germania. Preferably, the polishing agent may be ceria having a high polishing selectivity of the silicon oxide film to the silicon nitride film. The polishing agent may be contained in an amount of 0.1 to 10 wt %, preferably 1 to 7 wt %, more preferably 3 to 6 wt %.

The dispersant is a material that can prevent agglomeration of the polishing agent and may be, for example, poly(methacrylic acid), poly(acrylic acid), ammonium polymethacrylate, ammonium polycarboxylate or carboxyl-acrylic polymer. The dispersant may be contained in an amount of 0.0001 to 10 parts by weight with respect to 100 parts by weight of the polishing agent.

The second solvent may be water, preferably deionized water. The polishing agent suspension may further contain a pH adjusting agent, which is a weak acid or base.

The polishing slurry composition may further include a diluent. The diluent may be deionized water and contained in an amount of 50 to 700 parts by weight with respect to 100 parts by weight of the polishing agent suspension.

FIGS. 1 to 4 are cross-sectional views showing a method for producing a semiconductor device in accordance with an exemplary embodiment of the present invention.

Referring to FIG. 1, a substrate 10 including a first area A and a second area B is provided. The first area A may be a cell array area, and the second area B may be a peripheral circuit area adjacent to the cell array area.

Device patterns 13 are formed on the substrate 10. The device patterns 13 may be patterns including a silicon film located at the uppermost part. For example, the device patterns 13 may be gate patterns including a polysilicon film located at the uppermost part. An device isolation trench (not shown) may be formed in the substrate 10 before forming the gate patterns.

The device patterns 13 may be formed by sequentially stacking a gate insulating film 13a, a floating gate film 13b, an intergate insulating film 13c, and a control gate film 13d on the substrate 10 and patterning the films. Otherwise, the device patterns 13 may have a double layer of a gate insulating film and a gate conductive film. However, the film located at the uppermost part of the device patterns 13, i.e., the control gate film 13d or the gate conductive film may be polysilicon film.

Here, the device patterns 13 located on the first area A are arranged at a density higher than that of the device patterns 13 located on the second area B.

A first silicon oxide film 15 is formed on the device patterns 13. The first silicon oxide film 15 may be formed with a thickness that can sufficiently fill the gap between the device patterns 13 on the first area A. However, the first silicon oxide layer 15 may be formed with a thickness smaller than a thickness that can fill the gap between the device patterns 13 in the second area B. The first silicon oxide film 15 may be a borophosphosilicate glass (BPSG) film, a phosphosilicate glass (PSG) film, a high density plasma (HDP) film, a tetra ethyl ortho silicate (TEOS) film, an undoped silica glass (USG) film, or a high aspect ratio process (HARP) film.

Figure 2:
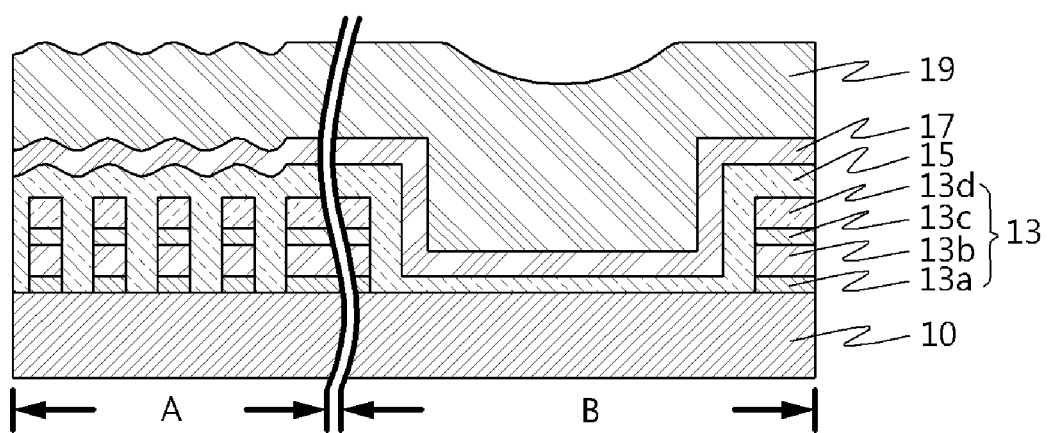

Referring to FIG. 2, a silicon nitride film 17 may be formed on the first silicon oxide film 15. When the first silicon oxide film 15 is formed with a thickness that can sufficiently fill the gap between the device patterns 13 on the first area A, the silicon nitride film 17 may not be formed on the side of the device patterns 13 but formed only on the top of the device patterns 13. Moreover, when the first silicon oxide film 15 is formed with a thickness smaller than a thickness that can fill the gap between the device patterns 13 on the second area B, the silicon nitride film 17 may be formed on the side of the device patterns 13 in the second area B.

A second silicon oxide film 19 may be formed on the silicon nitride film 17. The second silicon oxide film 19 may be formed with a thickness that can sufficiently fill the gap between the device patterns 13 on the second area B. the second silicon oxide film 19 may be formed of the same material as the first silicon oxide film 15.

Figure 3:
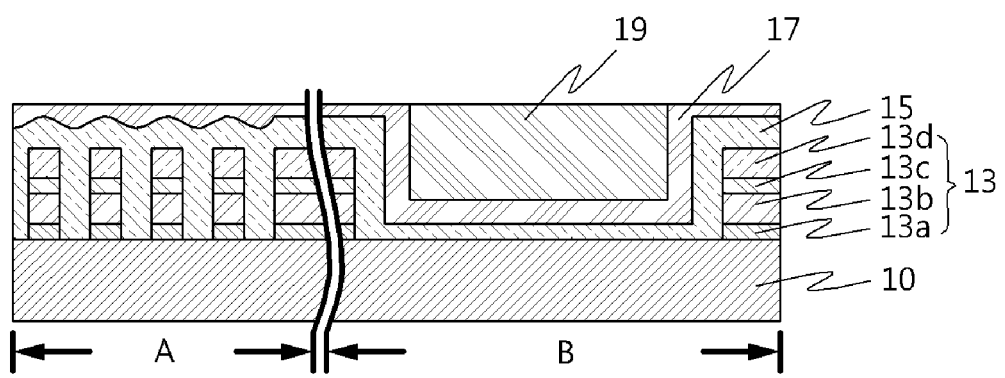

Referring to FIG. 3, the substrate with the second silicon oxide film 19 is loaded into a chemical mechanical polisher (CMP), and the second silicon oxide film 19 is polished by providing the above-mentioned polishing slurry composition (not shown) and a polishing pad on the second silicon oxide film 19.

As the second silicon oxide film 19 is polished, the silicon nitride film 17 on the top of the device patterns 13 is first exposed. The silicon nitride film passivation agent contained in the polishing slurring composition forms a passivation film on the silicon nitride film 17 exposed in the first area A, thereby reducing the polishing rate of the insulating film in the first area A compared to the second area B. Therefore, it is possible to prevent over-polishing in the first area A in which the density of the device patterns 13 is high, thereby forming a globally planarized surface. In other words, it is possible to primarily compensate for the pattern density effect of the device patterns 13.

However, the polishing selectivity of the silicon oxide films 15 and 19 to the silicon nitride film 17 of the polishing slurry composition may be 2 to 10. When the polishing selectivity of the silicon oxide films 15 and 19 to the silicon nitride film 17 is within the above range, the polishing rate is somewhat reduced from the time at which the silicon nitride film 17 is exposed, and thus it is possible to primarily compensate for the pattern density effect of the device patterns 13 and prevent the time required to remove the silicon nitride film 17 from being prolonged.

Figure 4:
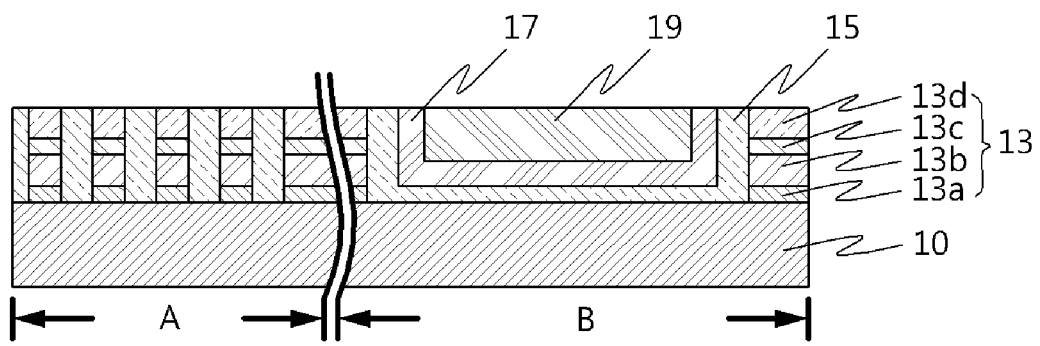

Referring to FIG. 4, the polishing is continuously performed after the silicon nitride film 17 is exposed such that the silicon film, which is the uppermost film of the device pattern 13, i.e., the polysilicon film 13d may be exposed. Here, the silicon film passivation agent contained in the polishing slurry composition forms a passivation film on the polysilicon film 13d, thereby preventing the polysilicon film 13d from being polished. The polishing selectivity of the silicon oxide films 15 and 19 to the polysilicon film 13d of the polishing slurry composition may be 50 or higher. When the polishing selectivity of the silicon oxide films 15 and 19 to the polysilicon film 13d is within the above range, the polishing rate is rapidly reduced from the time at which the polysilicon film 13d is exposed, thereby easily detecting the polishing end point.

Next, preferred examples will be given for a better understanding of the present invention. However, the following examples are provided only for the purpose of illustrating the present invention, and the present invention is not limited by the following examples.

Preparation Example 1 of Polishing Slurry Composition 1,000 g of an additive solution was prepared by adding 0.01 parts by weight of poly(acrylic acid) (PAA) having a weight average molecular weight of 10,000 with respect to 100 parts by weight of deionized water. The additive solution was mixed with 1,000 g of a ceria suspension containing 5 wt % ceria particles and stirred. Then, 5,000 g of deionized water was added thereto to prepare a polishing slurry composition.

Preparation Example 2 of Polishing Slurry Composition

A polishing slurry composition was prepared in the same manner as Preparation Example 1, except that 0.05 parts by weight of poly(acrylic acid) (PAA) was added with respect to 100 parts by weight of deionized water.

Preparation Example 3 of Polishing Slurry Composition

A polishing slurry composition was prepared in the same manner as Preparation Example 1, except that 0.1 parts by weight of poly(acrylic acid) (PAA) was added with respect to 100 parts by weight of deionized water.

Preparation Example 4 of Polishing Slurry Composition

A polishing slurry composition was prepared in the same manner as Preparation Example 1, except that 0.2 parts by weight of poly(acrylic acid) (PAA) was added with respect to 100 parts by weight of deionized water.

Preparation Example 5 of Polishing Slurry Composition

A polishing slurry composition was prepared in the same manner as Preparation Example 1, except that 0.5 parts by weight of poly(acrylic acid) (PAA) was added with respect to 100 parts by weight of deionized water.

Preparation Example 6 of Polishing Slurry Composition

A polishing slurry composition was prepared in the same manner as Preparation Example 1, except that 1.0 parts by weight of poly(acrylic acid) (PAA) was added with respect to 100 parts by weight of deionized water.

Preparation Example 7 of Polishing Slurry Composition 1,000 g of an additive solution was prepared by adding 0.01 parts by weight of poly(vinyl pyrrolidone) (PVP) having a weight average molecular weight of 3,500 with respect to 100 parts by weight of deionized water. The additive solution was mixed with 1,000 g of a ceria suspension containing 5 wt % ceria particles and stirred. Then, 5,000 g of deionized water was added thereto to prepare a polishing slurry composition.

Preparation Example 8 of Polishing Slurry Composition

A polishing slurry composition was prepared in the same manner as Preparation Example 7, except that 0.05 parts by weight of poly(vinyl pyrrolidone) (PVP) was added with respect to 100 parts by weight of deionized water.

Preparation Example 9 of Polishing Slurry Composition

A polishing slurry composition was prepared in the same manner as Preparation Example 7, except that 0.1 parts by weight of poly(vinyl pyrrolidone) (PVP) was added with respect to 100 parts by weight of deionized water.

Preparation Example 10 of Polishing Slurry Composition

A polishing slurry composition was prepared in the same manner as Preparation Example 7, except that 0.2 parts by weight of poly(vinyl pyrrolidone) (PVP) was added with respect to 100 parts by weight of deionized water.

Preparation Example 11 of Polishing Slurry Composition

A polishing slurry composition was prepared in the same manner as Preparation Example 7, except that 0.5 parts by weight of poly(vinyl pyrrolidone) (PVP) was added with respect to 100 parts by weight of deionized water.

Preparation Example 12 of Polishing Slurry Composition

A polishing slurry composition was prepared in the same manner as Preparation Example 7, except that 1.0 parts by weight of poly(vinyl pyrrolidone) (PVP) was added with respect to 100 parts by weight of deionized water.

Preparation Example 13 of Polishing Slurry Composition 1,000 g of an additive solution was prepared by adding 0.05 parts by weight of poly(acrylic acid) (PAA) having a weight average molecular weight of 10,000 and 0.1 parts by weight of poly(vinyl pyrrolidone) (PVP) having a weight average molecular weight of 3,500 with respect to 100 parts by weight of deionized water. The additive solution was mixed with 1,000 g of a ceria suspension containing 5 wt % ceria particles and stirred. Then, 5,000 g of deionized water was added thereto to prepare a polishing slurry composition.

Preparation Example 14 of Polishing Slurry Composition

A polishing slurry composition was prepared in the same manner as Preparation Example 13, except that 0.1 parts by weight of poly(acrylic acid) (PAA) was added with respect to 100 parts by weight of deionized water.

Preparation Example 15 of Polishing Slurry Composition

A polishing slurry composition was prepared in the same manner as Preparation Example 13, except that 0.2 parts by weight of polyvinyl pyrrolidone) (PVP) was added with respect to 100 parts by weight of deionized water.

Preparation Example 16 of Polishing Slurry Composition

A polishing slurry composition was prepared in the same manner as Preparation Example 13, except that 0.1 parts by weight of poly(acrylic acid) (PAA) and 0.2 parts by weight of poly(vinyl pyrrolidone) (PVP) were added with respect to 100 parts by weight of deionized water.

Comparative Example

A polishing slurry composition was prepared by mixing 1,000 g of an additive solution containing only deionized water with 1,000 g of a ceria suspension containing 5 wt % ceria particles, stirring the mixture, and adding 5,000 g of deionized water thereto.

The following table 1 shows the concentrations of PAA and PVP in the additive solutions in accordance with Preparation Examples 1 to 16 and the Comparative Example.

TABLE 1

|  | PAA (parts by weight with respect to 100 parts by weight of solvent) | PVP (parts by weight with respect to 100 parts by weight of solvent) |
| --- | --- | --- |
| Preparation Example 1 | 0.01 | 0 |
| Preparation Example 2 | 0.05 | 0 |
| Preparation Example 3 | 0.1 | 0 |
| Preparation Example 4 | 0.2 | 0 |
| Preparation Example 5 | 0.5 | 0 |
| Preparation Example 6 | 1 | 0 |
| Preparation Example 7 | 0 | 0.01 |
| Preparation Example 8 | 0 | 0.05 |
| Preparation Example 9 | 0 | 0.1 |
| Preparation Example 10 | 0 | 0.2 |
| Preparation Example 11 | 0 | 0.5 |
| Preparation Example 12 | 0 | 1 |
| Preparation Example 13 | 0.05 | 0.1 |
| Preparation Example 14 | 0.1 | 0.1 |
| Preparation Example 15 | 0.05 | 0.2 |
| Preparation Example 16 | 0.1 | 0.2 |
| Comparative Example | 0 | 0 |

Figure 5:
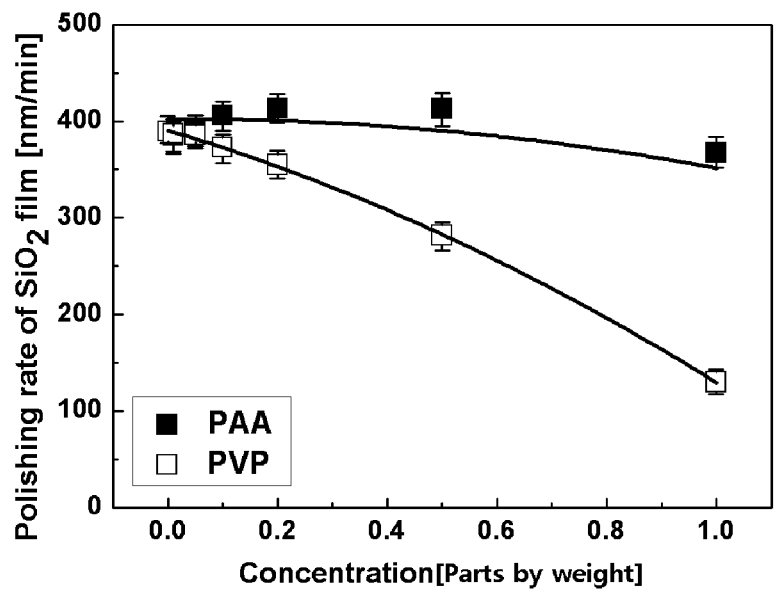
FIGS. 5 to 7 are graphs showing the polishing rates of a silicon oxide film, a silicon nitride film, and a polysilicon film of polishing slurry compositions in accordance with Preparation Examples 1 to 12.
Figure 6:
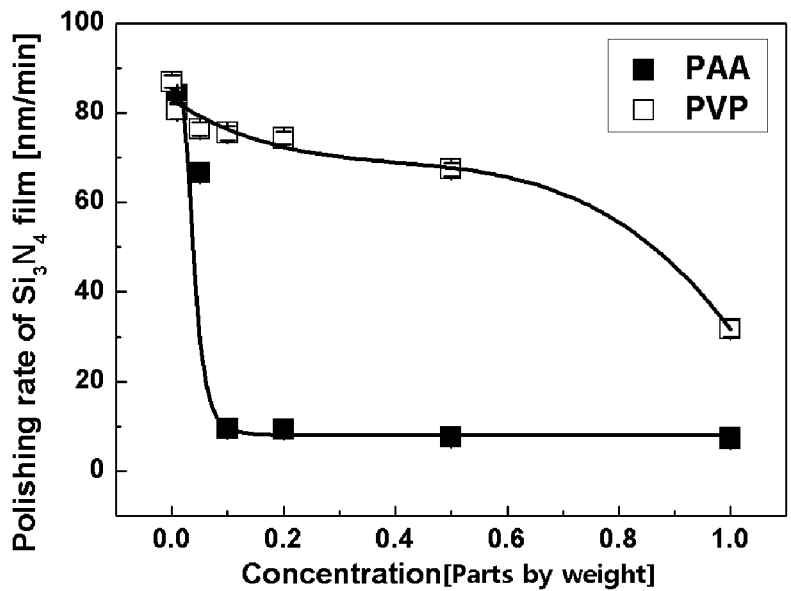
Figure 7:
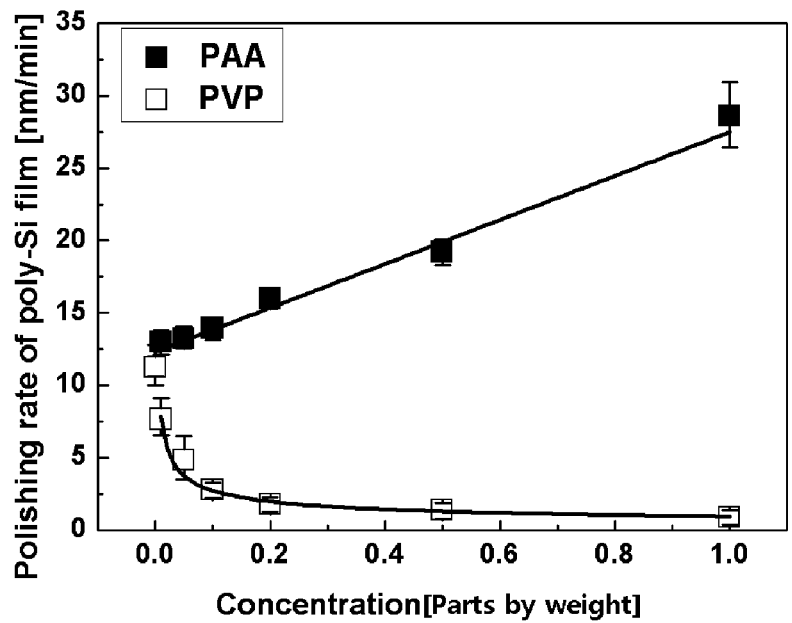

FIGS. 5 to 7 are graphs showing the polishing rates of a silicon oxide film, a silicon nitride film, and a polysilicon film of the polishing slurry compositions in accordance with Preparation Examples 1 to 12.

Referring to FIG. 5, it can be seen the polishing rate of the silicon oxide film is affected by the change in concentration of PVP rather than the change in concentration of PAA. In detail, it can be seen that the polishing rate of the silicon oxide film is gradually reduced with the increase in concentration of PVP.

Referring to FIG. 6, it can be seen that the polishing rate of the silicon nitride film is affected by the change in concentration of PAA rather than the change in concentration of PVP. In detail, it can be seen that the polishing rate of the silicon nitride film is rapidly reduced until the concentration of PAA reaches 0.1 parts by weight with respect to 100 parts by weight of the solvent in the additive solution and then saturated.

Referring to FIG. 7, it can be seen that the polishing rate of the polysilicon film is affected by the change in concentration of PVP rather than the change in concentration of PAA. In detail, it can be seen that the polishing rate of the polysilicon film is rapidly reduced until the concentration of PVP reaches 0.2 parts by weight with respect to 100 parts by weight of the solvent in the additive solution and then saturated.

Referring to FIGS. 5 to 7, it can be seen that the PAA can be bonded on the silicon nitride film to form a passivation film and the PVP can be bonded on the silicon film, i.e., the polysilicon film, to form a passivation film.

Figure 8:
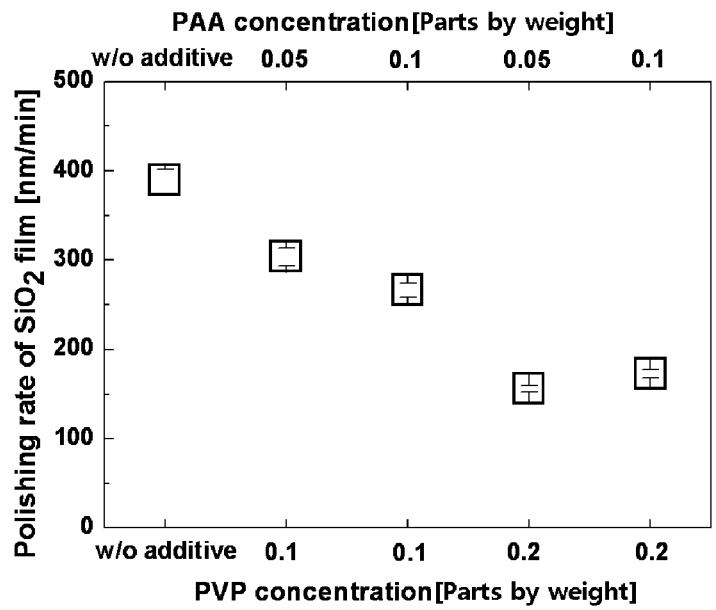
FIGS. 8 to 10 are graphs showing the polishing rates of a silicon oxide film, a silicon nitride film, and a polysilicon film of polishing slurry compositions in accordance with Preparation Examples 13 to 16.
Figure 9:
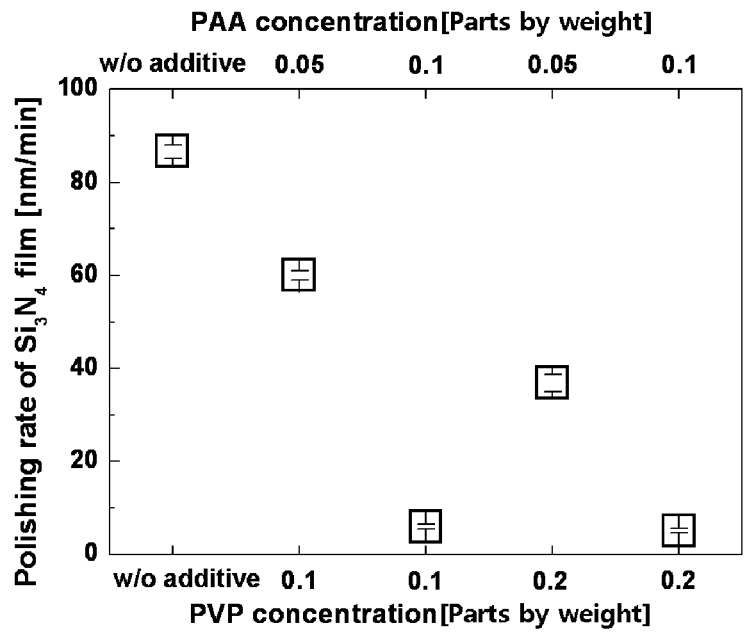
Figure 10:
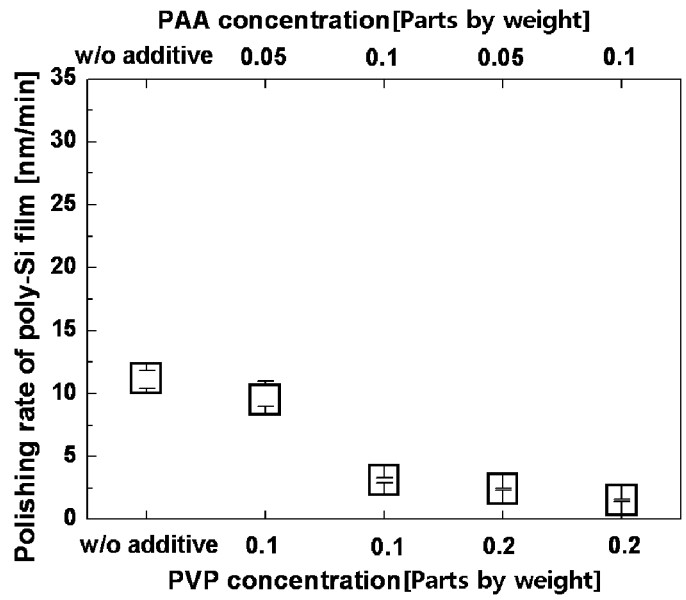

FIGS. 8 to 10 are graphs showing the polishing rates of a silicon oxide film, a silicon nitride film, and a polysilicon film of polishing slurry compositions in accordance with Preparation Examples 13 to 16.

Referring to FIG. 8, it can be seen that when the concentration of PAA is 0.05 or 0.1 parts by weight, if the concentration of PVP increases from 0.1 parts by weight to 0.2 parts by weight, the polishing rate of the silicon oxide film is reduced.

Referring to FIG. 9 it can be seen that when the concentration of PVP 0.1 or 0.2 parts by weight, if the concentration of PAA increases from 0.05 parts by weight to 0.1 parts by weight, the polishing rate of the silicon nitride film is rapidly reduced.

Referring to FIG. 10, it can be seen that when the concentration of PAA is 0.05 or 0.1 parts by weight, if the concentration of PVP increases from 0.1 parts by weight to 0.2 parts by weight, the polishing rate of the polysilicon film is reduced.

Figure 11:
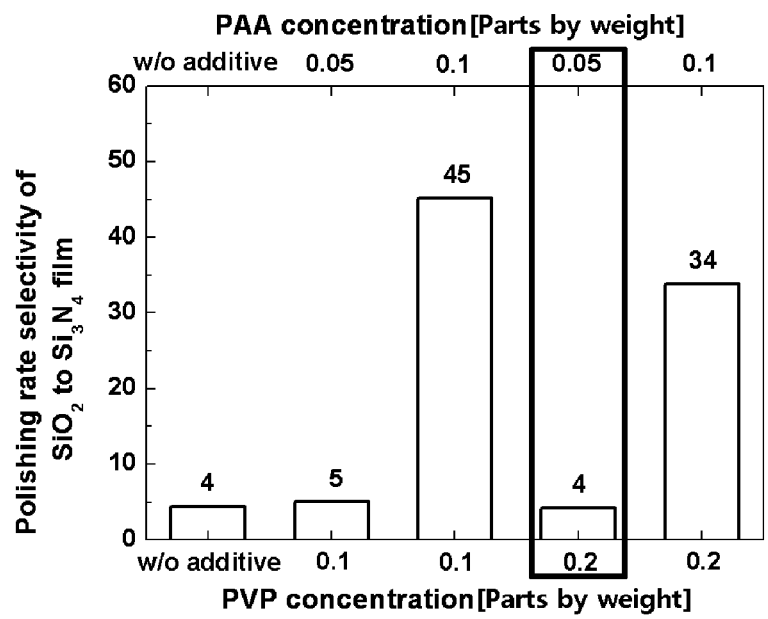
FIG. 11 is a graph showing the ratio of the polishing rate of a silicon oxide film to that of a silicon nitride film of polishing slurry compositions in accordance with Preparation Examples 13 to 16.
Figure 12:
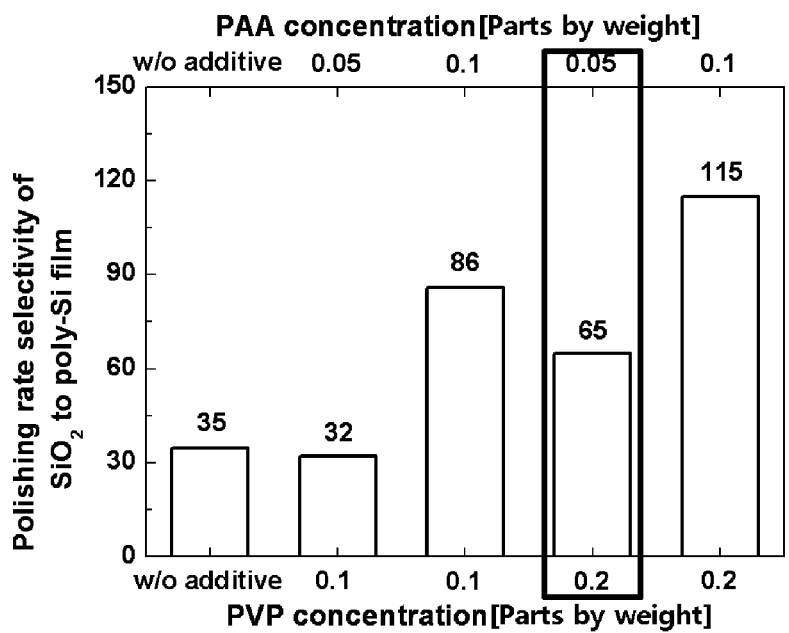
FIG. 12 is a graph showing the ratio of the polishing rate of a silicon oxide film to that of a polysilicon film of polishing slurry compositions in accordance with Preparation Examples 13 to 16.

FIG. 11 is a graph showing the ratio of the polishing rate of a silicon oxide film to that of a silicon nitride film of polishing slurry compositions in accordance with Preparation Examples 13 to 16, and FIG. 12 is a graph showing the ratio of the polishing rate of a silicon oxide film to that of a polysilicon film of polishing slurry compositions in accordance with Preparation Examples 13 to 16.

Referring to FIGS. 11 and 12, it can be seen that when the concentration of PAA is about 0.05 parts by weight and the concentration of PVP is about 0.2 parts by weight with respect to 100 parts by weight of the solvent in the additive solution, the ratio of the polishing rate of the silicon oxide film to that of the silicon nitride film is 4, and the ratio of the polishing rate of the silicon oxide film to that of the polysilicon film is 65. In this case, as described with reference to FIGS. 1 to 4, the polishing rate is somewhat reduced from the time at which the silicon nitride film is exposed, and thus it is possible to primarily compensate for the pattern density effect of the device patterns 13 and prevent the time required to remove the silicon nitride film from being prolonged. Moreover, the polishing rate is rapidly reduced from the time at which the polysilicon film is exposed, and thus it is possible to easily detect the polishing end point.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

The invention claimed is:

1. A method for producing a semiconductor device, the method comprising:
   forming device patterns including a silicon film at the uppermost part of the device patterns on a substrate including a first area and a second area, the device patterns on the first area having a density higher than that of the device patterns on the second area;
   forming a first silicon oxide film on the device patterns;
   forming a silicon nitride film on the silicon oxide film;
   forming a second silicon oxide film on the silicon nitride film; and
   chemically mechanically polishing the second silicon oxide film, the silicon nitride film, and the first silicon oxide film using one polishing slurry composition containing a polishing agent, a silicon nitride film passivation agent, and a silicon film passivation agent until the silicon film is exposed;
   wherein the polishing slurry composition is a mixture of 100 arts by weight of polishing agent suspension, 40 to 120 parts by weight of an additive solution, and 50 to 700 parts by weight of a diluent; and
   wherein the additive solution contains 100 parts by weight of a solvent, 0.01 to 0.1 parts by weight of the silicon nitride film passivation agent, and 0.1 to 0.3 parts by weight of the silicon film passivation agent.

2. The method of claim 1, wherein the first silicon oxide film has a thickness that can fill the gap between the device patterns on the first area.

3. The method of claim 1, wherein the device patterns are gate patterns including the silicon film at the uppermost part, and the silicon film is a polysilicon film.

4. The method of claim 3, wherein the first silicon oxide film has a thickness smaller than a thickness that can fill the gap between the device patterns on the second area.

5. The method of claim 4, wherein the silicon nitride film is formed on the side of the device patterns on the second area, and wherein the first silicon oxide film is positioned between the device patterns and the silicon nitride film on the second area.

6. The method of claim 1, wherein the silicon nitride film passivation agent is poly(acrylic acid), poly(alkyl methacrylate), acrylamide, methacrylamide, or ethyl-methacrylamide.

7. The method of claim 1, wherein the silicon film passivation agent is poly(vinyl pyrrolidone), vinylpyridine, or vinylpyrrolidone.

8. The method of claim 1, wherein the first silicon oxide film covers upper surfaces of the silicon film of the device patterns.

9. The method of claim 1, wherein the second silicon oxide film is formed with a thickness that can sufficiently fill the gap between the device patterns on the second area.

10. The method of claim 1, wherein the polishing selectivity of the silicon oxide films to the silicon nitride film of the polishing slurry composition is 2 to 10, and the polishing selectivity of the silicon oxide films to the polysilicon film of the polishing slurry composition may be 50 or higher.

11. A method for producing a semiconductor device, the method comprising:
   forming device patterns including a silicon film at the uppermost part of the device patterns on a substrate including a first area and a second area, the device patterns on the first area having a density higher than that of the device patterns on the second area;
   forming a first silicon oxide film to cover the upper surfaces of the silicon film of the device patterns;
   forming a silicon nitride film on the first silicon oxide film;
   forming a second silicon oxide film on the silicon nitride film; and
   chemically mechanically polishing the second silicon oxide film, the silicon nitride film, and the first silicon oxide film using one polishing slurry composition containing a polishing agent, a silicon nitride film passivation agent, and a silicon film passivation agent until the silicon film is exposed;
   wherein the polishing selectivity of the silicon oxide films to the silicon nitride film of the polishing slurry composition is 2 to 10, and the polishing selectivity of the silicon oxide films to the polysilicon film of the polishing slurry composition may be 50 or higher.

12. The method of claim 11, wherein the silicon nitride film passivation agent is poly(acrylic acid) and the silicon film passivation agent is poly(vinyl pyrrolidone).

13. The method of claim 12, wherein the polishing slurry composition is a mixture of 100 parts by weight of a polishing agent suspension, 40 to 120 parts by weight of an additive solution, and 50 to 700 parts by weight of a diluent, and the additive solution contains 100 parts by weight of a solvent, 0.01 to 0.1 parts by weight of the poly(acrylic acid), and 0.1 to 0.3 parts by weight of the poly(vinyl pyrrolidone).

* * * * *